United States Patent
Leith et al.

(10) Patent No.: US 7,269,217 B2
(45) Date of Patent: *Sep. 11, 2007

(54) PWM CONTROLLER WITH INTEGRATED PLL

(75) Inventors: James William Leith, Seattle, WA (US); Mark Dickmann, Bellevue, WA (US)

(73) Assignee: Intersil Americas Inc., Milpitas, CA (US)

( * ) Notice: Subject to any disclaimer, the term of this patent is extended or adjusted under 35 U.S.C. 154(b) by 765 days.

This patent is subject to a terminal disclaimer.

(21) Appl. No.: 10/264,359

(22) Filed: Oct. 4, 2002

(65) Prior Publication Data

US 2004/0066845 A1  Apr. 8, 2004

(51) Int. Cl.
*H03K 7/08* (2006.01)
*H03K 9/08* (2006.01)

(52) U.S. Cl. ............. 375/238; 375/376; 375/374; 375/375; 327/156; 327/159

(58) Field of Classification Search ......... 375/238, 375/376, 354, 371, 373, 374, 375, 295; 327/156, 327/159; 332/110; 455/113
See application file for complete search history.

(56) References Cited

U.S. PATENT DOCUMENTS

| | | | |
|---|---|---|---|
| 4,359,679 A * | 11/1982 | Regan | 323/272 |
| 4,363,002 A * | 12/1982 | Fuller | 331/1 A |
| 4,669,089 A * | 5/1987 | Gahagan et al. | 375/146 |
| 5,343,169 A * | 8/1994 | Debaty | 331/17 |
| 5,475,326 A | 12/1995 | Masuda | |
| 5,699,020 A | 12/1997 | Jefferson | |
| 5,822,387 A | 10/1998 | Mar | |
| 6,137,809 A * | 10/2000 | Martinez et al. | 370/503 |
| 6,150,889 A * | 11/2000 | Gulliver et al. | 331/14 |
| 6,208,216 B1 * | 3/2001 | Nasila | 332/110 |
| 6,215,361 B1 | 4/2001 | Lebouleux et al. | |
| 6,222,745 B1 | 4/2001 | Amaro et al. | |
| 6,853,252 B2 * | 2/2005 | Dickmann | 331/16 |
| 6,993,087 B2 * | 1/2006 | Rosnell et al. | 375/295 |
| 7,003,270 B2 * | 2/2006 | Maruo et al. | 455/113 |

FOREIGN PATENT DOCUMENTS

EP  0 564 377 A1  10/1993
EP  0 899 883 A1  3/1999

OTHER PUBLICATIONS

Linear Technology Corporation, "2-Phase, High Efficiency, Synchronous Step-Down Switching Regulators", LTC 1929/LTC 1929-PG, 1999.
SEMTECH, Bi-Phase/Dual Controller, Power Management, SC2420, 2001.
International Search Report for PCT/US 03/31316 dated Apr. 20, 2004.

* cited by examiner

*Primary Examiner*—Phuong Phu
(74) *Attorney, Agent, or Firm*—Paul A. Bernkopf; Graybeal Jackson Haley LLP (57) ABSTRACT

A pulse-width modulation (PWM) controller to supply power to electronic components using a phase lock loop (PLL) is presented. A PWM controller comprises an input node operable to receive a reference signal and a phase-locked loop (PLL). The PLL comprises an oscillator operable to receive an error-correction signal and to generate an oscillator signal having a frequency that is related to the error-correction signal, a phase-frequency detector (PFD) coupled to the oscillator and operable to receive the reference signal and to generate the error-correction signal based upon a phase difference between the reference signal and a feedback signal, and a suppression circuit coupled to the PFD and operable to periodically enable the PFD to generate the error-correction signal.

30 Claims, 9 Drawing Sheets

PWM CONTROLLER WITH INTEGRATED PLL

CROSS-RELATED APPLICATION

This application is related to U.S. application Ser. No. 10/264,360 titled PHASE-LOCK LOOP HAVING PROGRAMMABLE BANDWIDTH which was filed on the same day as this application and is hereby incorporated by reference.

BACKGROUND OF THE INVENTION

Figure 1:
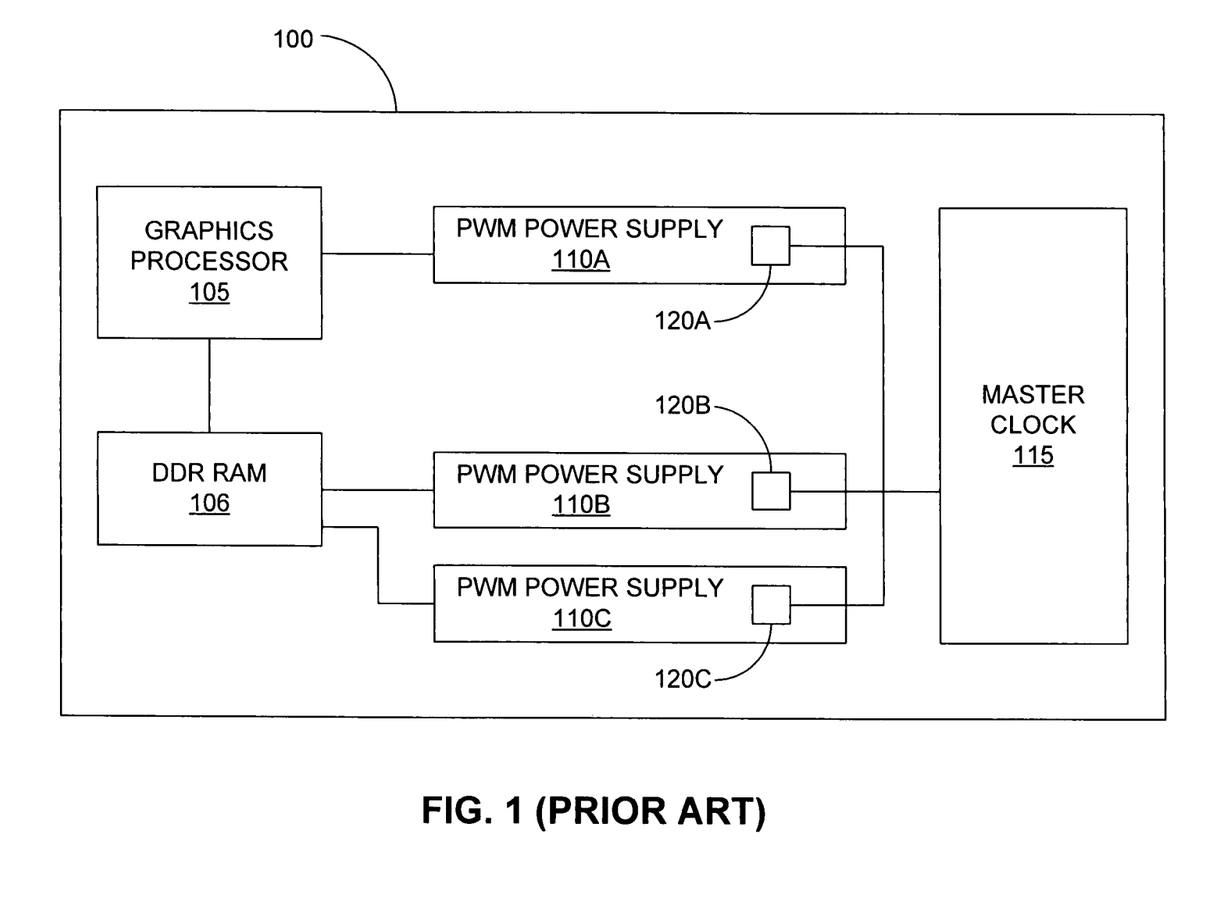
FIG. 1 is a block diagram of a conventional graphics board that synchronizes multiple PWM power supplies with a master clock signal.

A graphics board is a printed-circuit board that typically includes at least one graphics processor and other electronic components that process and display graphics or other video data in a computer system. FIG. 1 is a block diagram of a conventional graphics board 100 that includes a graphics processor 105. Typically, one of the electronic components connected to the graphics processor 105 is a double-data-rate random-access memory (DDS RAM) chip 106. Both the graphics processor 105 and the DDR RAM 106 typically have high power requirements as compared to other electronic components. For example, the graphics processor 105 typically requires 5-15 amps (A) of power at 1.6 volts (V), and the DDR RAM 106 typically 5-10 A and 10-20 A at 1.25 V and 2.5 V, respectively. Because the processor 105 and DDR RAM 106 have such high power requirements, pulse-width-modulated (PWM) switching power supplies 110a, 110b, and 110c are typically provided for the graphics processor 105 and the DDR RAM 106. Typically, the PWM power supplies 110a, 110b, and 110c each include a separate PWM-controller chip, although, these controllers can be integrated into the graphics processor 105 and DDR RAM 106 chips, respectively.

Ideally, the operating frequencies of the PWM power supplies 110a, 110b, and 110c are the same. If, however, these frequencies are different, undesirable "beat" frequencies can result. A beat frequency is equal to the difference between the two frequencies. Unfortunately, the beat frequency can cause undesirable artifacts to appear in a video display.

One technique for reducing or eliminating the beat frequency is to have a master clock chip 115 that generates a master clock signal for all three PWM power supplies 110a, 110b, and 110c. The PWM controllers 120a, 120b, and 120c will typically divide down the frequency of the master clock signal to a desired PWM frequency. For example, a typical frequency for the PWM power supplies 110a, 110b, and 110c can range from 100 kilohertz to 1 megahertz, and the master clock frequency may be an order of magnitude above the PWM frequency. By providing the same master clock frequency to all the PWM controllers 120a, 120b, or 120c, ideally all of the PWM signals should have the same frequency thus eliminating any beat frequency.

But, providing a master clock signal can have several disadvantages. Because the PWM controllers 120a, 120b, and 120c have high-impedance clock inputs noise may cause jitter and other artifacts on the master clock signal. Furthermore, the master clock signal paths to the PWM controllers 120a, 120b and 120c may have different propagation delays. Such jitter, artifacts, and signal delays may cause the PWM signals generated by the PWM controllers 120a, 120b and 120c to have different frequencies. Again, having different frequencies may give rise to a beat frequency that may cause visual artifacts in the video display. Furthermore, the master clock chip which takes up space on the graphics board 100 and, thus, increases component count, overall cost, and manufacturing complexity.

Another technique for reducing or eliminating the beat frequency is, instead of using a master clock chip 115, for two of the PWM controllers 120b, and 120c, (slaves) of the graphics board 105 to lock onto the PWM signal of the other PWM controller 120a (master) using a phase-locked loop (PLL). The slave PLLs can each generate one or more slave-PWM output signals that are phase locked to the master-PWM signal, and, that have the same frequency as the master-PWM signal. One problem with using a slave PLL, however, is that because it typically operates at a relatively low bandwidth (e.g. 100 Hz to 100 kHz) the PLL typically requires relatively large passive filter components (typically a capacitor) to set the bandwidth. Such a component is typically too large to be integrated onto a PWM controller chip 120, and thus, must be located on the graphics board 100 external to the PWM controller chip 120. Unfortunately, such an external component occupies space on the graphics board 100 and, thus, often increases the component count, overall cost and manufacturing complexity of the graphics board 105. Furthermore, the external component requires that the PWM controller chip 120 have an additional coupling pin and thus, often increases the size, cost, and manufacturing complexity of the PWM controller chip 120.

One technique for eliminating the external filter component requirement is to provide the PLL with a variable-gain charge pump. Such a charge pump includes multiple, parallel-output-drive stages that can be selectively activated to increase or decrease the output current, and thus the gain, of the charge pump. By increasing or decreasing the charge pump gain, one can respectively increase or decrease the PLL bandwidth. A problem with this technique, however, is that the multiple drive stages occupy a significant area of the PWM controller chip 120 that includes the PLL.

SUMMARY OF THE INVENTION

In one embodiment of the invention, a PWM controller with an integrated PLL comprises an input node operable to receive a reference signal from an internal source such as a master clock or external source such as a master-PWM signal generated from another PWM controller. The PLL comprises an oscillator operable to receive an error-correction signal and to generate an oscillator signal having a frequency that is related to the error-correction signal, a phase-frequency detector (PFD) coupled to the oscillator and operable to receive the reference signal and to generate the error-correction signal based upon a phase difference between the reference signal and a feedback signal, and a suppression circuit coupled to the PFD and operable to periodically enable the PFD to generate the error-correction signal.

There are several advantageous aspects to this embodiment of the invention. First, PWM controllers (slave) that are locked into phase with a master PWM signal allow a user to eliminate the need for additional clocking circuitry for all PWM power supplies. In the past, external clocks were used to synchronize all PWM controllers. By providing a master PWM signal generated from a designated master-PWM controller, additional space on printed circuit boards can be preserved.

In another embodiment of the invention, an integrated phase-locked loop (PLL) includes a programmable delay that allows the PLL to have a relatively low bandwidth without the need for an external component. Providing such a suppression circuit in a PLL provides advantages that include reducing the PFD gain. By lowering the PFD gain, one lowers the PLL bandwidth such that one can use a filter capacitance that is small enough to be integrated onto a chip that includes the PLL. In addition, such a suppression circuit allows one to use a charge pump having a single output stage.

Another advantage is that using slave PWM controllers also allows a user to adjust the phase of each slave PWM signals so as to minimize power supply ripple. Specifically, because the PWM power supplies for the various electronic components are supplied from a main power supply, imperfect filtering and large current requirements cause ripple effects on the power supply. Ripple effects will cause artifacts on a display. By offsetting when specific electronic components draw power from the main power supply through phase-shifting, the ripple effects can be reduced.

Another advantage is that a slave PWM controller can be configured to determine when a synchronization mode is required. When synchronization mode is required, the slave PWM controller is phase-locked with a master PWM controller. If, however, the slave PWM controller should operate in an independent mode, an internal frequency is generated for use by the PWM controller.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following discussion is presented to enable a person skilled in the art to make and use the invention. The general principles described herein may be applied to embodiments and applications other than those detailed below without departing from the spirit and scope of the present invention. The present invention is not intended to be limited to the embodiments shown, but is to be accorded the widest scope consistent with the principles and features disclosed or suggested herein.

Figure 2:
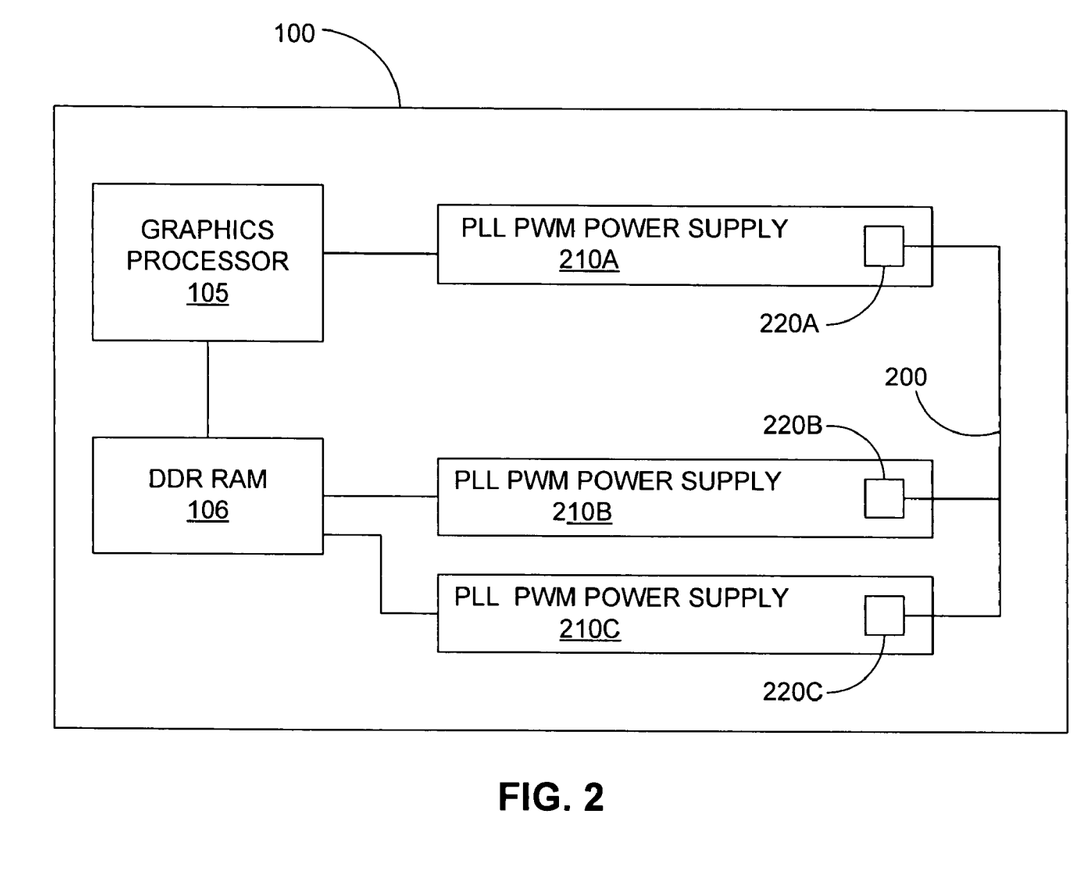
FIG. 2 is a block diagram of a graphics board that utilizes an embodiment of a PWM controller according to an embodiment of the invention.

FIG. 2 shows a block diagram of a typical graphics board 100 that utilizes an embodiment of the invention. As was the case with respect to FIG. 1, the graphics board 100 includes a graphics processor 105 connected to a DDR RAM 106. Different from the prior art of FIG. 1, however, each of these components are driven by a PWM power supply 210a, 210b, and 210c having respective PWM controllers 220a, 220b, and 220c with integrated PLLs. The PWM controllers 220 are described below in conjunction with FIG. 6, and the PLLs are described below in conjunction with FIG. 3. The graphics processor 105 is driven by a single PWM power supply 210a and the DDR RAM 106 is driven by a pair of PWM power supplies 210b and 210c. In this embodiment, the PWM power supply 210a is the master and the PWM power supplies 210b and 210c are the slaves, although any one of the supplies 210a-210c can be the master with the remaining two supplies being the slaves. The master PWM controller 220a generates a master PWM signal in a conventional manner, and the slave PWM controllers 210b and 210c each include an integrated PLL (not shown in FIG. 2) that locks onto the master PWM signal and generates a respective slave PWM signal having the same frequency as the master PWM signal. By precisely synchronizing the PWM frequencies of the slave PWM power supplies 210b and 210c with the PWM frequency of the master PWM power supply 210a, beat frequencies are virtually eliminated. The difference, however, between the PLLs of the controllers 220a-220c and conventional PLLs is that they can have a relatively low loop bandwidth approximately 1 to 3 kHz in this embodiment—without requiring an external filter element or variable-gain charge pump. Furthermore, as discussed below in conjunction with FIGS. 3-6, in some embodiments one can program the PLLs with the desired bandwidth, or can program the slave PLLs to generate slave PWM signals that have respective phase shifts with respect to the master PWM signal.

Figure 3:
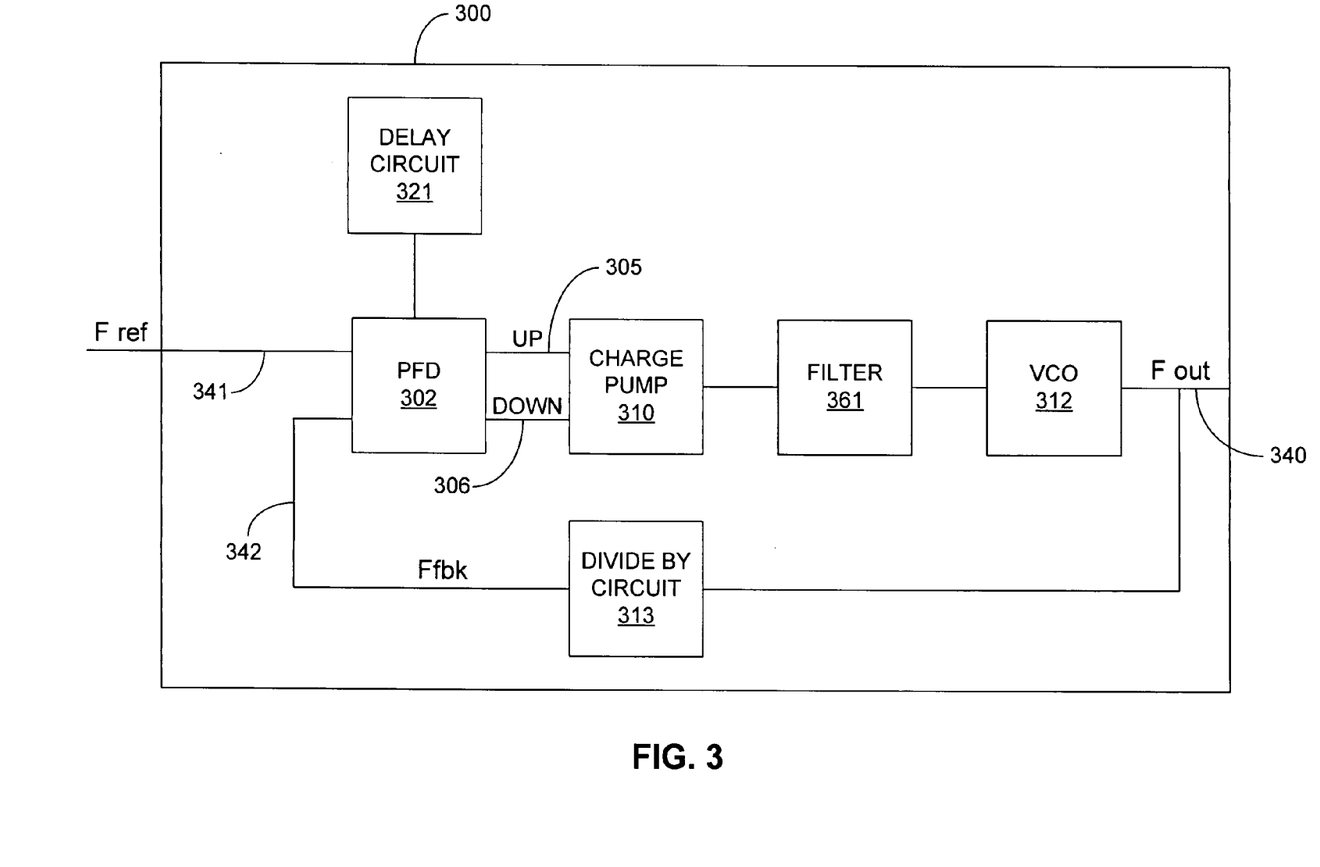
FIG. 3 is a block diagram of a PLL according to an embodiment of the invention.

FIG. 3 is a block diagram of a PLL 300 according to an embodiment of the invention. The PLLs of the PWM controllers 220a-220c of FIG. 2 can be the same as or similar to the PLL 300. But, the PLL 300 can be used in virtually any application that calls for a PLL.

The PLL 300 includes a phase frequency detector (PFD) 302, an error-correction signal suppression circuit 321, a conventional charge pump 310, a conventional filter 361, a conventional VCO 312, and an optional frequency divider circuit 313. As discussed below, the suppression circuit 321 allows one to adjust the loop bandwidth of the PLL 300 without the need for the filter 361 to incorporate a large capacitor or other filter element and without the need for the charge pump 310 to have multiple, switchable-output stages for gain control.

Generally, the PLL 300 receives a reference signal 341 and produces an output signal 340 having a frequency that is the same as or that is a multiple of the frequency of the reference signal. Furthermore, the reference and output signals are typically in phase with one another, although in one embodiment the divider circuit 313 can impart a predetermined phase shift to the output signal as discussed below in conjunction with FIG. 5. With the exception of the suppression circuit 321, each part of the PLL 300 will only be described in brief detail as PLLs are well known in the art.

The PFD 302 detects a difference between the phases of the reference signal 341 and a feedback signal 342, and generates a phase-error signal (UP or DOWN) that has a duration that is proportional to the phase difference. Specifically, the phase-error signal activates the charge pump 310 so as to "push" the VCO 312 in a direction that will cause the frequency of the output signal 340 to be in phase with the reference signal 341 and to have a frequency equal to N (the divisor of the circuit 313) times the frequency of the reference signal. The "direction" of the push depends upon the direction of the phase difference. For example, if the PFD 302 determines that the feedback signal 342 leads the reference signal 341 (feedback frequency higher than reference frequency), then the PFD 302 will send a DOWN pulse 306 to the charge pump 310. The DOWN pulse has a duration that is proportional to the phase difference and causes the VCO 361 to reduce the frequency of the output signal 340. If, however, the PFD 302 determines that the feedback signal 342 lags the reference signal 341 (feedback frequency lower than reference frequency), then the PFD 302 will send an UP pulse 305 to the charge pump 310. The UP pulse has a duration that is proportional to the phase difference and causes the VCO 312 to increase the frequency of the output signal 340.

The charge pump 310 generates a phase-correction pulse having a duration that is equal to that of the received UP or DOWN phase-error pulse, and the filter 361, which is typically a capacitor (not shown) coupled in parallel to the output of the charge pump 310, integrates the pulse to provide a control voltage. The VCO 312 generates the output signal 340 having a frequency that is proportional to the level of the control voltage, and the divide circuit 313 generates the feedback signal 342 from the output signal 340. As discussed below, the suppression circuit 321 allows the filter capacitor to be small enough for integration onto the chip that incorporates the PLL 300, and eliminates the need for the charge pump 310 to have an adjustable gain.

The suppression circuit 321, working in conjunction with other logic circuitry, decreases the loop bandwidth of the PLL 300 by introducing programmable error-correction suppression into the loop. The suppression circuit 321 causes a decrease in loop bandwidth by enabling the PFD 341 to generate the error-correction signal only periodically. In one embodiment, the PFD 302 generates error-correction pulses, and the suppression circuit 321 suppresses a pre-determined number of the error-correction pulses. Longer periods between successive enablements of the PFD 341 provides for a lower loop bandwidth, and vice versa. Consequently, the loop has the highest bandwidth, and thus the PLL 300 corrects phase errors at its fastest, when the pulse suppression circuit 321 does not suppress any pulses, i.e., no error-correction pulses are eliminated. Furthermore, because it is programmable, the suppression circuit 321 allows one to change the loop bandwidth without changing the values of the elements that compose the filter 261, and allows one to set the loop bandwidth to a relatively low value without requiring large, external (to the chip incorporating the PLL 300) filter elements.

Specifically, in one embodiment, the suppression circuit 321 counts the cycles of the reference and feedback signals 341 and 342 (these signals are virtually identical when the PLL 300 is in lock), and allows the PFD 302 to provide the error-correction signal to the charge pump 310 only every X cycles, where X is the count value with which the suppression circuit 321 is programmed. For example, where X=5, the charge pump 310 receives an error-correction signal UP or DOWN only once every five cycles of the signals 341 and 342. As compared with no error-correction signals being suppressed, a suppression rate of X=5 lowers the loop bandwidth by decreasing the number of error-correction pulses, and thus increases the time required for the PLL 300 to correct for phase differences between the reference and feedback signals 341 and 342. Although the suppression rate X is described as being programmable so that one can select the desired loop bandwidth, the suppression circuit 321 may be designed such that the value of X is fixed. Furthermore, where the value of X is programmable, one should analyze the loop transfer function of the PLL 300 to insure that the programmed value of X does not cause the PLL to become unstable.

Figure 4A:
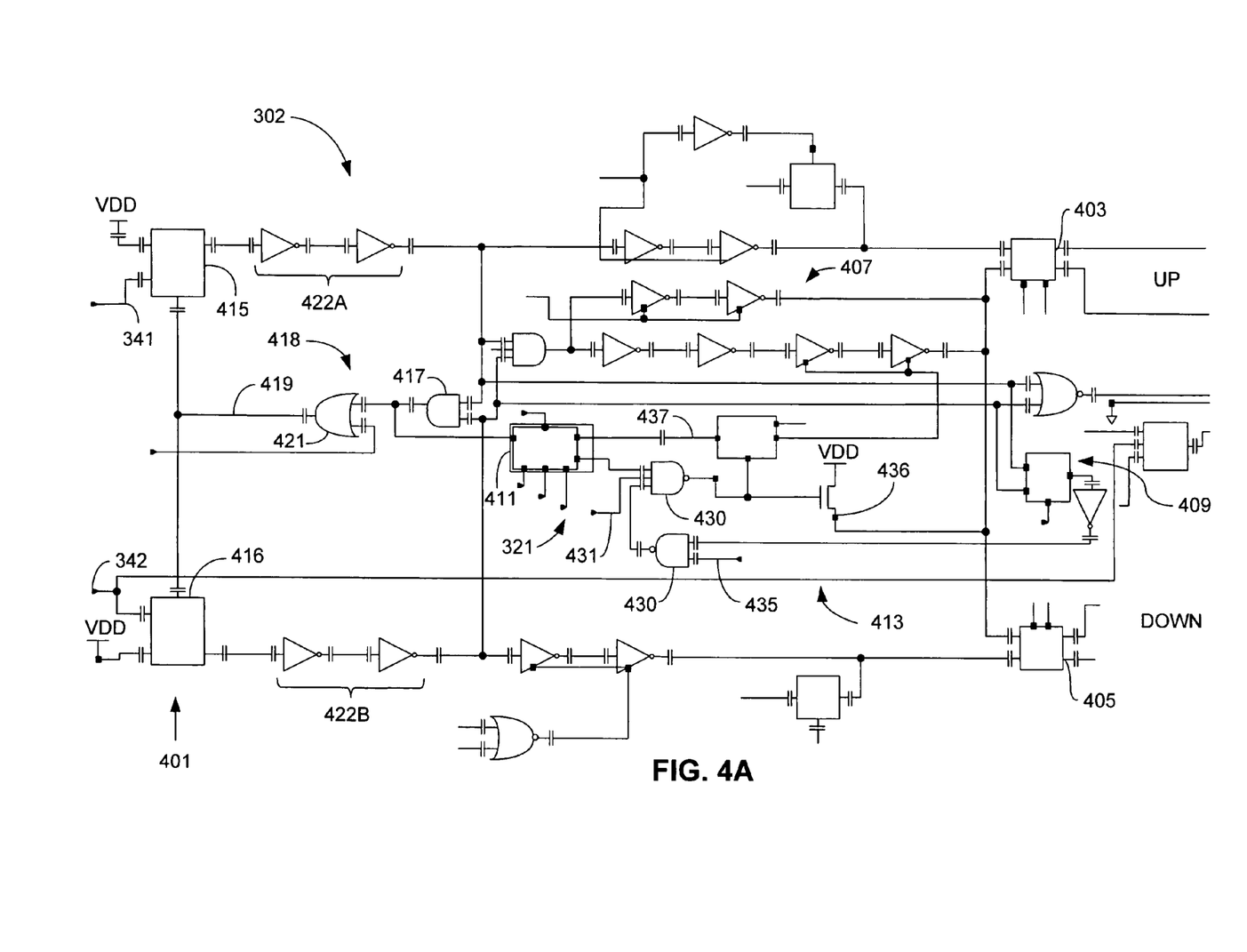
FIG. 4A is a schematic diagram of a typical embodiment of some aspects of the PLL of FIG. 3.

FIG. 4A is a schematic diagram of the PED 302 and the suppression circuit 321 of FIG. 3 according to an embodiment of the invention. The PED 302 includes a phase-difference detect circuit 401, enable multiplexers 403 and 405, optional feed forward circuit 407, and an optional lock-detect circuit 409. The suppression circuit 321 includes a programmable counter 411 and a logic circuit 413. Each of these circuits is described in greater detail below.

The phase-difference detect circuit 401 includes a pair of flip-flops 415 and 416 for detecting the respective edges—the rising edges in this embodiment—of the reference signal 341 and the feedback signal 342, and a reset circuit 418 for resetting the flip-flops after they have detected the corresponding edges of both the reference 341 and feedback 342 signals More specifically, in response to the reference signal 341 transitioning from a logic-0 to a logic-1 (rising edge), the flip-flop 415 generates a logic-1 for an intermediate-up signal (IUP). Likewise, in response to the feedback signal 342 transitioning from a logic-0 to a logic-1, the flip-flop 416 generates a logic-1 for an intermediate-down signal (IDOWN). Consequently, if IUP transitions to logic-1 before IDOWN transitions to logic-1, the feedback signal lags the reference signal by a phase difference that is proportional to the time difference between the logic-1 transitions of IUP and IDOWN. Conversely, if IUP transitions to logic-1 after IDOWN, the feedback signal 342 leads the reference signal 341 by a phase difference that is proportional to the time difference between the logic-1 transitions of IUP and IDOWN. Moreover, if IUP and IDOWN transition to logic-1 at the same time, the feedback signal 342 is in phase with the reference signal 341 for that cycle. As discussed above in conjunction with FIG. 3, the UP and DOWN signals provided by the multiplexers 403 and 405 control the charge pump 310, which in turn controls the VCO 312, to force the feedback signal 342 to have the same phase and frequency as the reference signal 341.

The reset circuit 418 includes an AND gate 417 that generates a RESET signal 419 for resetting the flip-flops 415 and 416 after the lagging one of the pulses IUP and IDOWN transitions to a logic 1. The flip-flops 415 and 416, now reset, are then ready for the next logic-0-to-logic-1 transitions of the reference signal 341 and the feedback signal 342. Because during reset there is a finite propagation delay through the AND gate 417, an optional OR gate 421, the flip flops 415 and 416, and the inverters 422a and 422b, the durations of IUP and IDOWN at active logic-1 levels are extended. If IUP and IDOWN were passed directly to the charge pump 310 (FIG. 3), then these extended durations would be passed to the charge pump as well. Because it is sometimes desired to reduce or eliminate these extended durations, the PFD 302 may include the feed-forward circuits 407 and the multiplexers 403 and 405 to generate the signals UP and DOWN having reduced durations. The operation of the feed-forward circuits 407 is further discussed in commonly owned U.S. patent application Ser. No. 60/359,270, entitled PHASE DETECTOR AND METHOD FOR A SHORTENING PHASE-ERROR CORRECTION PULSE, which is incorporated herein by reference.

The suppression circuit 321 controls the loop bandwidth of the PLL 300 (FIG. 3) by suppressing some of the error-correction pulses, thus reducing the bandwidth of the PLL 300. Generally, the counter 411 is programmed with a count value and uses the reset signal from the AND gate 417 as a clock signal. The counter 411 counts up or down from the count value for each reset pulse (which has the same frequency as the reference signal 341 and the feedback signal 342 when the PLL is in lock mode) until the counter reaches a predetermined value such as zero. When the counter reaches the predetermined value, it enables the multiplexers 403 and 405 via the logic 413 to generate the signals UP and DOWN. The counter 411 then resets and begins the process again.

An embodiment of the suppression circuit 321 is now described in detail. The counter 411 is ripple counter formed from three flip-flops (not shown individually). Data is loaded into the flip-flops when a load signal 437 is high. The counter 411 counts down when a pulse is detected from the output of the AND gate 417 until all flip-flop outputs are low. Once the flip-flops have all transitioned to low, the load signal 437 resets the flip-flops and the process begins again. While loading the flip-flops, the multiplexers 403 and 405 are enabled. Between loading cycles, however, the multiplexers 403 and 405 are disabled.

Because sometimes it is desirable to deactivate the suppression circuit 321 until the PLL 300 locks the feedback signal 342 onto the reference signal 341, the lock-detect circuit 409 may be included. For example, to decrease the capture time of the PLL 300—the capture time is the amount of time that the PLL 300 requires to locate and lock onto the frequency of the reference signal—one may want the PLL 300 to have maximum bandwidth during signal capture. Including an adaptive frequency synthesizer (not shown) in the PLL 300 is one way to reduce the PLL's capture time. The lock-detect circuit 409 combined with the suppression circuit 321 and a programmable loop filter resistor (not shown) with a variable value (the resistor value is dependent upon the PFD gain for loop stability) can be used to implement the adaptive frequency synthesizer. By deactivating the suppression circuit 321 during signal capture when the adaptive frequency synthesizer is required to change the VCO frequency quickly, the PLL can locate and lock onto the reference signal within a minimal amount of time. And, by activating the suppression circuit 321 during lock mode, the PLL 300 can maintain the superior noise performance of a smaller loop bandwidth.

During each cycle of the reference signal when the feedback signal is locked thereto, IUP and IDOWN will be the same virtually the entire cycle. Therefore, the lock-detect circuit 409 effectively compares the percentage of time that IUP and IDOWN are the same to a predetermined threshold. If the measured percentage is greater than the threshold, then the lock-detect circuit 409 declares lock and enables the pulse suppression circuit 321 via a NAND gate 430. Otherwise, the lock-detect circuit 409 disables the suppression circuit 321 until lock is achieved.

Still referring to FIG. 4A, as discussed above in conjunction with FIG. 3, the suppression circuit 321 allows the filter 361 to have a smaller capacitance that can be integrated onto a chip when the loop bandwidth of the PLL 300 is at a point where conventional PLLs would require an external capacitor. Furthermore, the suppression circuit 321 allows one to use a regular charge pump 310, i.e., a charge pump with a single output stage that is not constructed to have multiple, switchable-output stages for gain adjustment. This allows the charge pump 310 to produce a relatively high-valued error-correction pulse when operating and thus to have a relatively high signal-to-noise ratio. Further, it often reduces the amount of layout space that would otherwise be required by an adjustable charge pump.

Figure 4B:
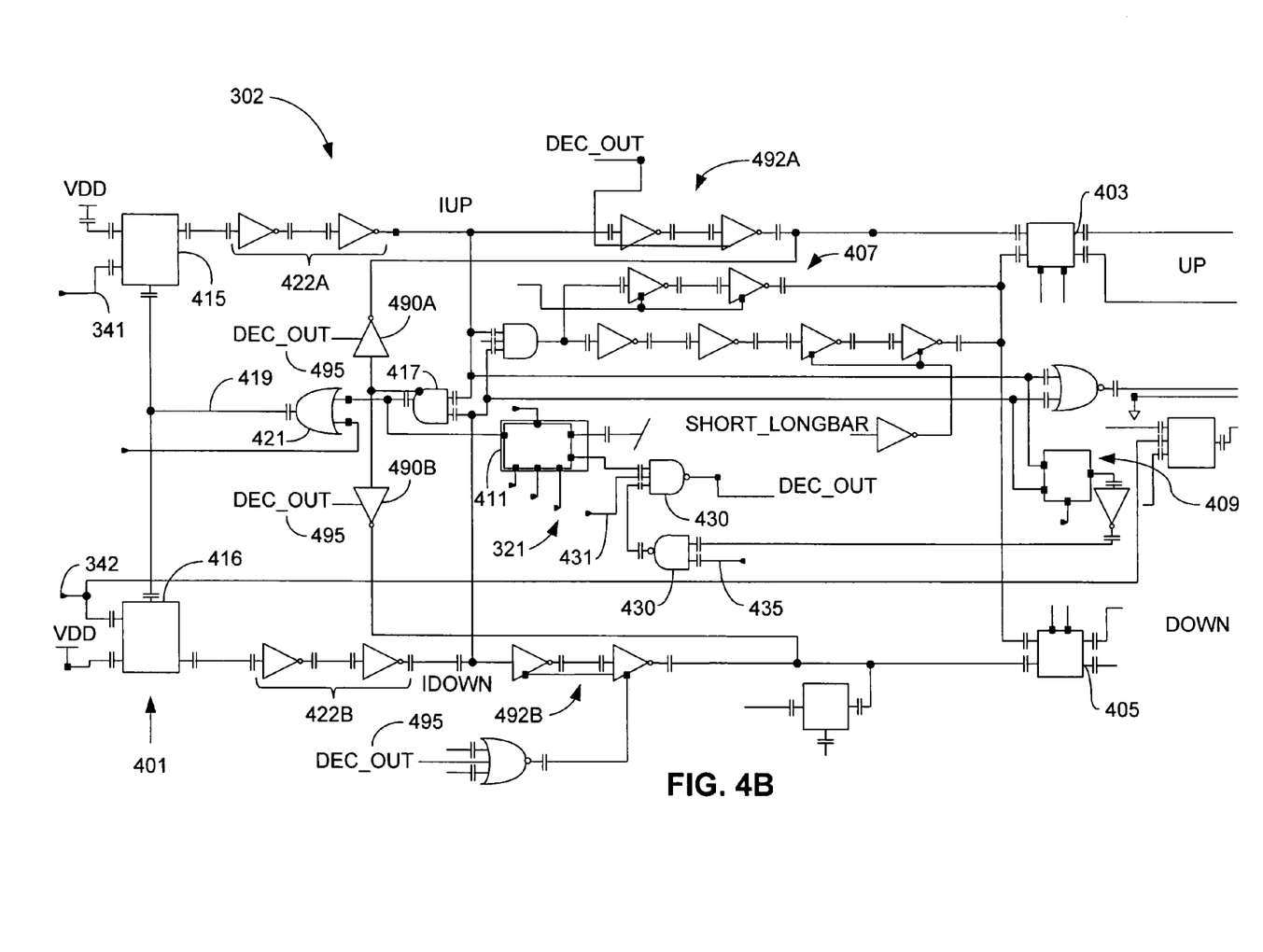
FIG. 4B is a schematic diagram of another typical embodiment of some aspects of the PLL of FIG. 3.

FIG. 4B is a schematic diagram of another embodiment of the PFD 302 and the suppression circuit 321 of FIG. 3. Again, the PFD 302 includes a phase-difference detect circuit 401, enable multiplexers 403 and 405, optional feed forward circuit 407, and an optional lock-detect circuit 409. The suppression circuit 321 includes a programmable counter 411, a logic circuit, and inverters 490a and 490b, which maintain the loop perturbations at a frequency high enough for the low-pass filter 261 (FIG. 3) to filter out. Specifically, each error-correction pulse causes perturbations in the loop even if UP and DOWN are simultaneously active to indicate zero phase error. One cause of these perturbations is the turning on and off of the charge pump 310 (FIG. 3). When the feedback signal 342 is locked to the reference signal 341 and no error-correction pulses are suppressed, the perturbations have a fundamental frequency equal to the frequency of the reference signal. Because the filter 261 typically has a cutoff frequency that is significantly lower than the frequency of the reference signal, the filter removes virtually all of the perturbations. But when the suppression circuit 321 suppresses error-correction pulses, then the perturbations have a lower fundamental frequency. But if the fundamental perturbation frequency is near or significantly below the cutoff frequency of the filter 261, then the filter may pass some of the perturbation energy, which may cause jitter or other undesirable noise in the VCO output signal 340 (FIG. 3).

Consequently, to maintain the fundamental frequency of the perturbations at a frequency high enough for filter 261 to remove the perturbations, the inverters 490a and 490b simultaneously generate UP and DOWN from the reset signal—which has the same frequency as the reference signal 341 when the PLL 300 is in lock mode—when the circuit 321 is suppressing the error-correction pulses IUP and IDOWN from the flip-flops 415 and 416. Specifically, before the counter 411 reaches the predetermined value X, it tristates inverters 492a and 492b to uncouple IUP an IDOWN from the multiplexers 403 and 405. At the same time, the inverters 490a and 490b couple the reset signal (generated when both IUP and IDOWN are logic 1) to the multiplexers 403 and 405, which simultaneously generate UP and DOWN equal to logic 1 for the duration of the reset signal. Because UP and DOWN are active logic 1 for the same duration, the charge pump 310 imparts a net zero phase correction to the VCO 312. But because the charge pump is active, it does generate a perturbation. Consequently, the inverters 490a and 490b allow the suppression circuit 321 to suppress error correction without suppressing perturbations. To avoid signal conflict at the multiplexors 403 and 405, however, the counter 411 tristates the inverters 490a and 490b when it reaches the predetermine value X, and thus when it is not suppressing the error-correction pulses UP and DOWN. Specifically, when the counter 411 reaches the predetermined suppression rate value, a DEC_OUT signal 495 is generated. Each inverter 490a and 490b is coupled to this signal and is held in tristate while the DEC_OUT signal 495 is present. The DEC_OUT signal 495 goes low after the counter 411 resets and the error-correction signal UP or DOWN has been generated.

Figure 5:
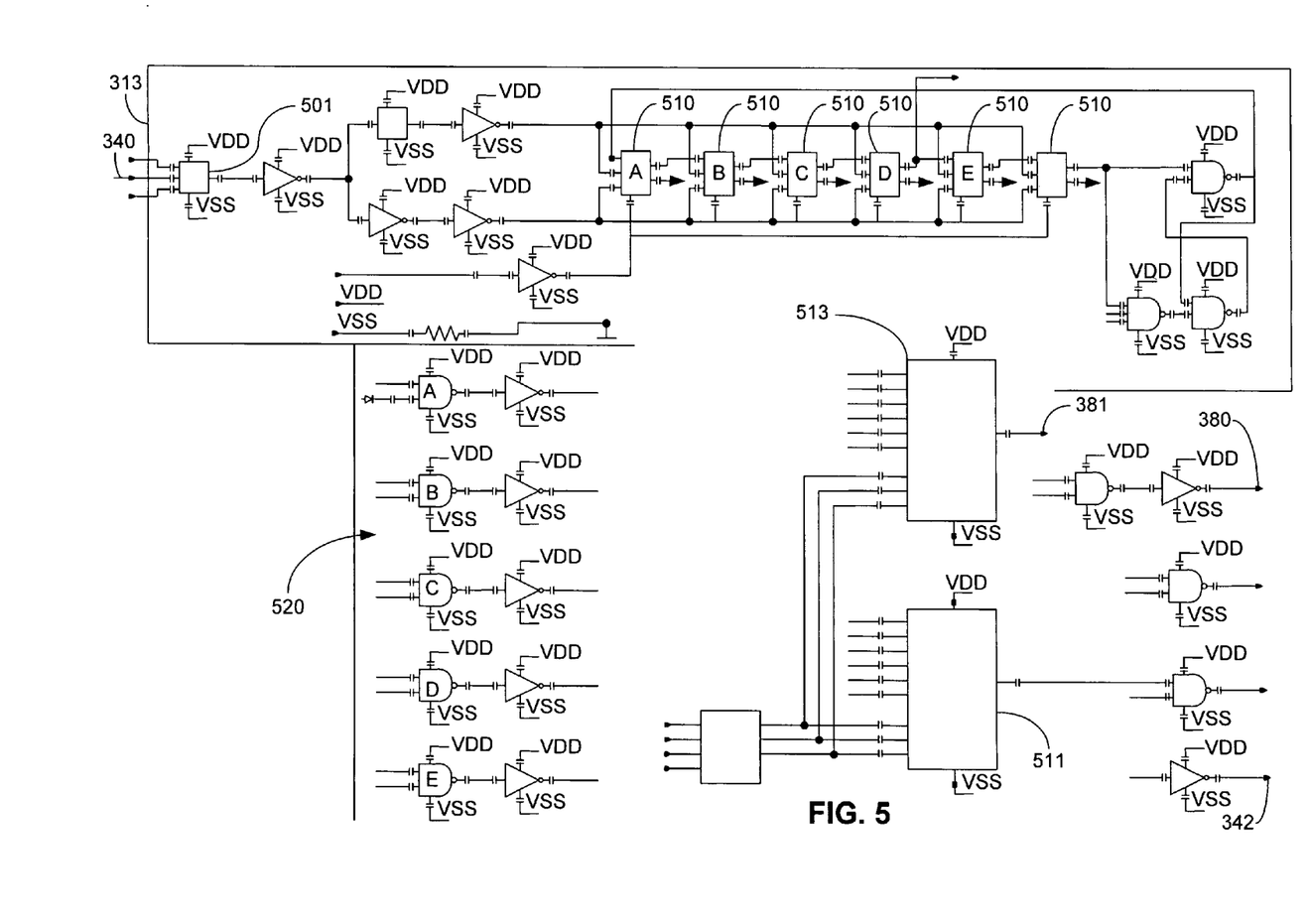
FIG. 5 is a schematic diagram of a frequency divider circuit of the PLL of FIG. 3 according to an embodiment of the invention.

FIG. 5 is schematic diagram of the frequency divider circuit 313 of FIG. 3 according to an embodiment of the invention. The frequency divider 313 receives the output signal 340 as an input to a multiplexor 501 which provides pulses to a series of flip-flops 510. Each flip-flop in the series of flip-flops provides an input for the next flip-flop in the series. As a result, any one of the flip-flop outputs Q1-Q6 (selectable via a multiplexer 511) can be used as a frequency divider 313 output that is an exact 1/N multiple of the output signal 340.

Still referring to FIG. 5, another optional feature of the frequency divider circuit 313 is that it allows one to introduce a predetermined phase shift into the output signal 342 with respect to the reference signal 341 (FIG. 3). Delay gates 520 generate signals PH 90, PH 120, PH 150, PH 180, and PH 210, which all have a predetermined frequency and have phase shifts with respect to the output signal 340 of 90, 120, 150, 180, and 210 degrees, respectively. Therefore, using a multiplexer 513 to select one of these signals as the feedback signal 342 introduces a corresponding phase shift into the output signal 340. As discussed above in conjunction with FIG. 2 and below in conjunction with FIG. 6, offsetting the phases of the slave PWM signals with respect to the master PWM signal may reduce ripple on the main power supply by staggering the times when the PWM supplies draw power from the main supply. In one alternative of this embodiment, the designer pre-selects the phase shifts, which do not change during operation of the PWM supplies. Alternatively, the PWM supplies can monitor ripple on the main supply and dynamically shift the relative phases of the slave PWM signals so as to maintain a desired level of ripple on the main power supply.

Figure 6:
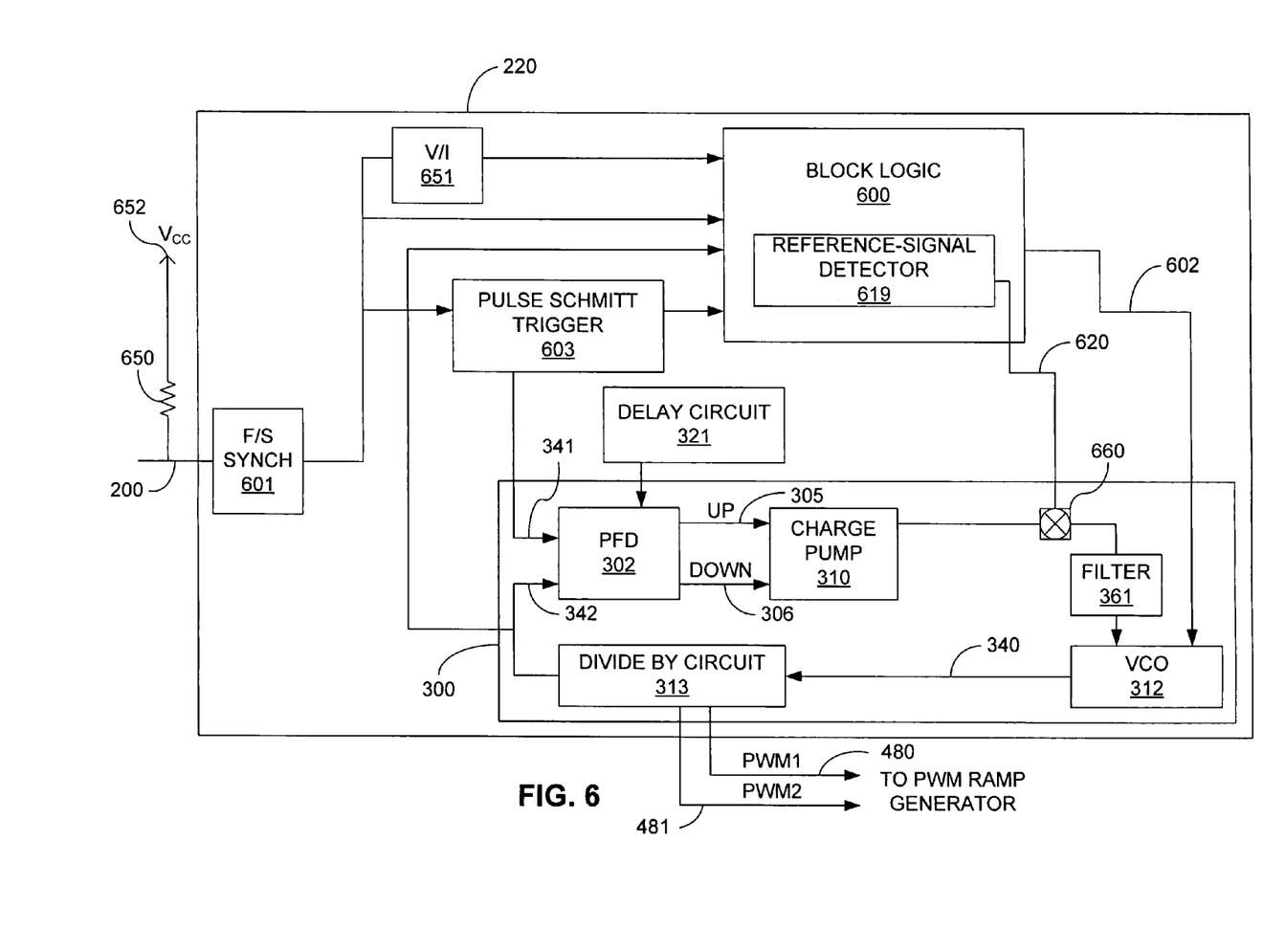
FIG. 6 is a block diagram of a typical PWM controller with an integrated PLL according to an embodiment of the invention.

FIG. 6 is a block diagram of one of the PWM controllers 220a, 220b, and 220c of FIG. 3 according to an embodiment of the invention. There are two modes in which the PWM controller 220 operates. In an independent mode, the PWM controller 220 does not lock the output signal 340 to the reference signal 341 or to any other reference. A master PWM controller, such as the PWM controller 220a of FIG. 2, typically operates in the independent mode. In a PLL-mode, the PLL 300 of the PWM controller 220 synchronizes the output frequency 340 to the reference signal 341 received from the master PWM controller 220a or from another source via the synchronization input 200. The slave PWM controllers 220b and 220c of FIG. 2 typically operate in PLL-mode.

When in PLL-mode, an FS/synch input 601 receives the reference signal 341 from a master PWM controller. In FIG. 2, the PWM controller 220a for the graphics processor 105 is an example of a master PWM controller, but, alternatively, some other PWM controller can be the master depending on the design of a particular system. Most commercially available PWM controllers 220 make the PWM signal available on a pin, and thus can serve as a master.

If not in PLL-mode, a resistor 650 is connected between the FS/synch input 601 and either ground (not shown) or a power supply 652. A voltage-to-current converter 651 converts the voltage that the resistor 650 generates at the input 601 into a current that the logic 600 converts into a VCO control voltage on the line 602. Therefore, one selects a value for the resistor 650 that causes the VCO 312 to generate an output signal 340 having the desired frequency.

The PWM controller 220 can automatically determine which mode, independent mode or PLL-mode, in which to operate. To make this determination, a reference-signal detector 619, which may be part of the block logic 600, senses pulses from a Schmitt trigger 603, which is connected to the FS/synch 601 terminal. If the PLL mode is disabled (default condition) but the reference-signal detector 619 senses pulses for a first predetermined time, then the reference-signal detector 619 determines that a master reference signal is present at the input terminal 200 and enables the PLL 300 via line 620 and a switch 660. Conversely, if the PLL-mode is enabled and the reference-signal detector 619 senses pulses of the feedback signal 342 for a second predetermined time without simultaneously detecting pulses from the Schmitt trigger 603, the reference-signal detector 619 disables the PLL 300 via line 620 and the switch 660. The first and second predetermined times may be fixed or may be programmable. The detector 619 detects a signal by discharging a capacitor every time it detects an edge of the signal. In between edges the capacitor charges to a logic level that enables a counter (not shown). If the counter reaches a predetermined count value (corresponding to the first or second predetermined time), then the reference-signal detector 619 determines that the no signal is present. But as long as edges are present, the counter never reaches the predetermined count value. The reference-signal detector 619 includes at least two of these detect circuits, so there are at least two predetermined count values, a first one corresponding to the first predetermined time and a second one corresponding to the second predetermined time. These predetermined count values may be fixed or programmable.

The block logic 600 also detects whether the value of the resistor 650 is either too high or too low, and, if the resistor is out of range, sets the VCO 312 to generate a predetermined maximum (resistor value too low) or minimum (resistor value to high) frequency. The voltage-to-current converter 651 also includes a current limiter so that such an undervalued resistor 650 does not cause an over-current condition.

While the PWM controller 220 operates in the PLL (slave) mode, the PLL 300 operates, as discussed above in conjunction with FIGS. 3-5, to lock the feedback signal 342 to the reference signal 341. The frequency divider circuit 313 provides one or more slave PWM signals—here two such signals PWM1 and PWM2—to a conventional PWM ramp generator (not shown), which generate a corresponding number of ramps (not shown) for regulating the PWM supply 210 (FIG. 2). As discussed above in conjunction with FIG. 5, the frequencies of PWM1 and PWM2 are integer multiples—six in one in embodiment—of the frequency of the reference signal 341. In addition, PWM1 and PWM2 may have predetermined phase shifts with respect to the reference signal 341. Furthermore, in one embodiment, the suppression circuit 321 is programmable to have a count value in the range of 32-1024. Moreover, the filter 361 or another portion of the PLL 300 may include programmable resistance values that allow one to adjust the loop gain to maintain loop stability for a particular count value.

Figure 7:
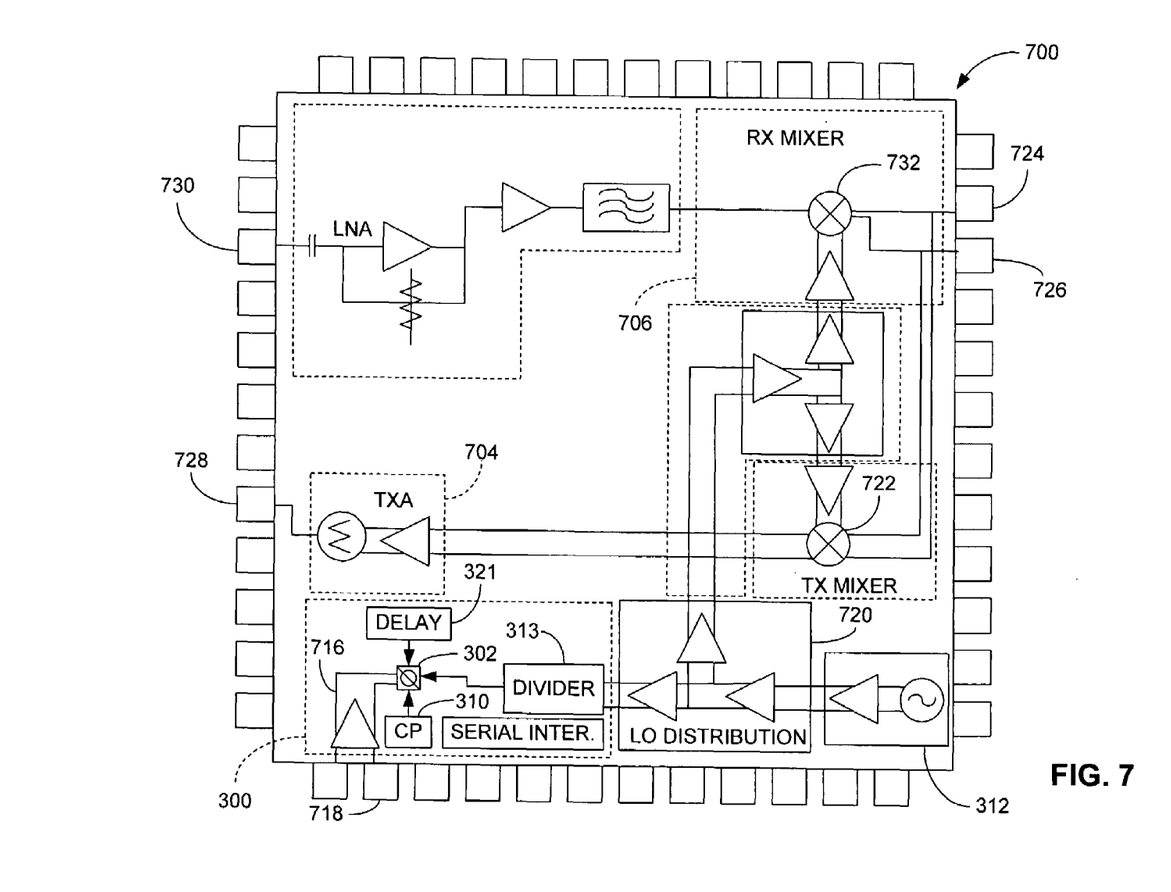
FIG. 7 is a Wireless-Area-Network (WAN) transmitter/receiver that can incorporate the PLL of FIG. 3 according to an embodiment of the invention.

FIG. 7 is a Wireless-Area-Network (WAN) transmitter/receiver 700 that can incorporate the PLL 300 of FIG. 3 according to an embodiment of the invention. In addition to the PFD 302, charge pump 310, VCO 312, frequency divider 313, suppression circuit 321 and the filter 361 (omitted from FIG. 7 for clarity), the PLL 300 includes a terminal 718 for receiving the reference signal and a local-oscillator (LO) distributor 720 for distributing the output of the VCO 312 as an LO signal. In addition to the PLL 300, the transmitter/receiver 700 includes a transmitter 704, and a receiver 706. The transmitter 704 includes a mixer 722 that modulates the LO with a differential base-band data signal received from a computer (not shown) via data terminals 724 and 726. The transmitter 704 then provides this modulated data signal to a transmit-terminal 728 for wireless transmission to a remote receiver (not shown). Similarly, the receiver 706 receives a modulated data signal from a remote wireless transmitter (not shown) via a terminal 730, and includes a mixer 732 that demodulates the received data signal with the LO signal and provides a differential demodulated data signal to the computer via the terminals 724 and 726. The PLL 300 is operable to synchronize the LO signal from the VCO 312 to the reference signal received on terminal 718. In one embodiment, the suppression circuit 321 is programmable to implement a count value of 0-7. The transmitter/receiver also includes other circuits that are conventional, and that are thus omitted from FIG. 7 for brevity.

Figure 8:
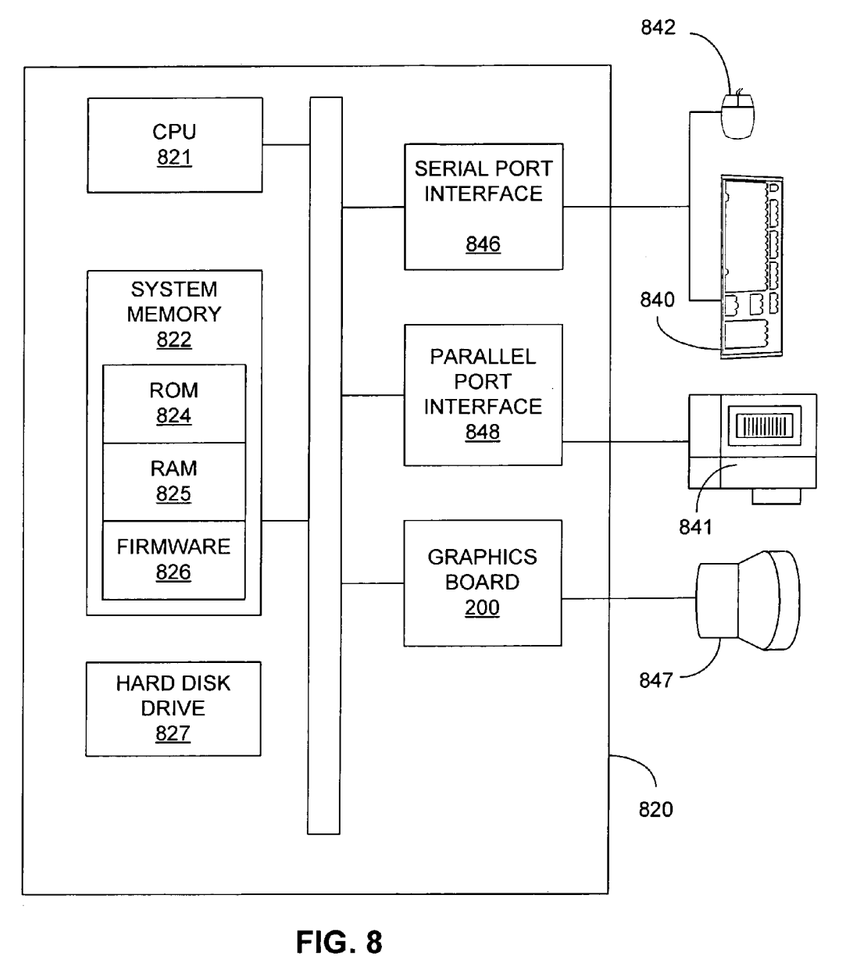
FIG. 8 is a block diagram of a computer system that can incorporate the graphics board of FIG. 2 according to an embodiment of the invention.

FIG. 8 is a block diagram of a general-purpose computer system 820 that incorporates the graphics board 200 of FIG. 2 according to an embodiment of the invention. The computer system 820 (e.g., personal or server) includes one or more processing units 821, system memory 822, and a system bus 823. The system bus 823 couples the various system components including the system memory 822 to the processing unit 821. The system bus 823 may be any of several types of busses including a memory bus, a peripheral bus, and a local bus using any of a variety of bus architectures. The system memory 822 typically includes read-only memory (ROM) 824 and random-access memory (RAM) 825. Firmware 826 containing the basic routines that help to transfer information between elements within the computer system 820 is also contained within the system memory 822. The computer system 820 may further include a hard disk-drive system 827 that is also connected to the system bus 823. Additionally, optical drives (not shown), CD-ROM drives (not shown), floppy drives (not shown) may be connected to the system bus 823 through respective drive controllers (not shown) as well.

A user may enter commands and information into the computer system 820 through input devices such as a keyboard 840 and pointing device 842. These input devices as well as others not shown are typically connected to the system bus 823 through a serial port interface 846. Other interfaces (not shown) include Universal Serial Bus (USB) and parallel ports 840. A monitor 847 or other type of display device may also be connected to the system bus 823 via an interface such as the graphics card 200.

We claim:

1. A pulse-width modulation controller comprising:
    a input node operable to receive a reference signal; and
    a phase-locked loop comprising:
        an oscillator operable to receive an error-correction signal and to generate a first PWM signal having a frequency that is related to the error-correction signal;
        a phase-frequency detector coupled to the oscillator and operable to receive the reference signal and to generate the error-correction signal based upon a phase difference between the reference signal and a feedback signal derived from the PWM signal; and
        a suppression circuit coupled to the phase-frequency detector and, while the feedback signal is synchronized with the reference signal, operable to periodically disable the phase-frequency detector from generating the error-correction signal in response to a logical AND of the reference signal and the feedback signal.

2. The pulse-width modulation controller of claim 1 wherein the reference signal comprises a master PWM signal.

3. The pulse-width modulation controller of claim 1, further comprising an oscillator control circuit that is operable to set the frequency of the PWM signal in the absence of the reference signal.

4. The pulse-width modulation controller of claim 1 wherein the phase-locked loop further comprises a frequency-divider circuit operable to generate the feedback signal from the PWM signal.

5. The pulse-width modulation controller of claim 4 wherein the frequency divider circuit generates the feedback signal having a frequency equivalent to the frequency of the reference signal.

6. A pulse-width modulation controller comprising:
    a input node operable to receive a reference signal; and
    a phase-locked loop comprising:
        an oscillator operable to receive an error-correction signal and to generate a first PWM signal having a frequency that is related to the error-correction signal;
        a phase-frequency detector coupled to the oscillator and operable to receive the reference signal and to generate the error-correction signal based upon a phase difference between the reference signal and a feedback signal derived from the PWM signal;
        a suppression circuit coupled to the phase-frequency detector and operable to periodically enable the phase-frequency detector to generate the error-correction signal; and
        wherein the suppression circuit is operable to enable the phase-frequency detector once every predetermined number of transitions of a logical AND of the reference and feedback signals.

7. The pulse-width modulation controller of claim 6 wherein the predetermined number of transitions is six.

8. A pulse-width modulation controller comprising:
    a input node operable to receive a reference signal; and
    a phase-locked loop comprising:
        an oscillator operable to receive an error-correction signal and to generate a first PWM signal having a frequency that is related to the error-correction signal;
        a phase-frequency detector coupled to the oscillator and operable to receive the reference signal and to generate the error-correction signal based upon a phase difference between the reference signal and a feedback signal derived from the PWM signal;
        a suppression circuit coupled to the phase-frequency detector and, while the feedback signal is synchronized with the reference signal, operable to periodically disable the phase-frequency detector from generating the error-correction signal; and
        wherein the suppression circuit enables the phase-frequency detector once every predetermined number of transitions of a reset signal, the reset signal transitioning when the reference signal and the feedback signal have the same logic level.

9. The pulse-width modulation controller of claim 4, wherein the frequency divider generates a second PWM signal.

10. The pulse-width modulation controller of claim 9, wherein the second PWM signal is phase shifted with respect the phase of the first PWM signal.

11. The pulse-width modulation controller of claim 1 wherein the phase-locked loop further comprises a filter for filtering the error-correction signal.

12. A pulse-width modulation controller comprising:
an input node operable to receive a reference signal; and
a phase-locked loop comprising:
- an oscillator operable to receive first and second error-correction signals and to generate an oscillator signal having a frequency that is related to the error-correction signals;
- a frequency divider circuit operable to generate a feedback signal and a PWM signal derived from the oscillator signal;
- a phase-frequency detector coupled to the oscillator and operable to receive the reference signal and to generate first and second intermediate error-correction signals based upon a phase difference between the reference signal and the feedback signal, and to generate the first and second error-correction signals from the first and second intermediate error-correction signals, respectively; and
- a suppression circuit coupled to the phase-frequency detector and, while the phase difference is within a predetermined lock threshold, operable to periodically disable the phase-frequency detector from generating the first and second error-correction signals in response to a logical AND of the first and second intermediate error-correction signals.

13. The pulse-width modulation controller of claim 12 wherein the frequency divider circuit is operable to impart a pre-determined phase shift to the PWM signal with respect to the reference signal.

14. A pulse-width modulation controller comprising:
an input node operable to receive a reference signal; and
a phase-locked loop comprising:
- an oscillator operable to receive an error-correction signal and to generate an oscillator signal having a frequency that is related to the error-correction signal;
- a frequency divider circuit operable to generate a feedback signal and a PWM signal derived from the oscillator signal;
- a phase-frequency detector coupled to the oscillator and operable to receive the reference signal and to generate the error-correction signal based upon a phase difference between the reference signal and the feedback signal; and
- a suppression circuit coupled to the phase-frequency detector and operable to periodically enable the phase-frequency detector to generate the error-correction signal;
- wherein the frequency divider circuit imparts a pre-determined phase shift to the PWM signal with respect to the reference signal; and
- wherein the pre-determined phase shift is equal or approximately equal to 90 degrees.

15. A pulse-width modulation controller comprising:
an input node operable to receive a reference signal; and
a phase-locked loop comprising:
- an oscillator operable to receive an error-correction signal and to generate an oscillator signal having a frequency that is related to the error-correction signal;
- a frequency divider circuit operable to generate a feedback signal and a PWM signal derived from the oscillator signal;
- a phase-frequency detector coupled to the oscillator and operable to receive the reference signal and to generate the error-correction signal based upon a phase difference between the reference signal and the feedback signal; and
- a suppression circuit coupled to the phase-frequency detector and operable to periodically enable the phase-frequency detector to generate the error-correction signal;
- wherein the frequency divider circuit imparts a pre-determined phase shift to the PWM signal with respect to the reference signal; and
- wherein the pre-determined phase shift is equal or approximately equal to 180 degrees.

16. A power supply circuit, comprising:
a master PWM power supply that generates first regulated supply voltage and a master PWM signal; and
a slave PWM power supply that generates a second regulated supply voltage and receives the master PWM signal, the slave PWM power supply comprising:
- an input node operable to receive the master PWM signal; and
- a phase-locked loop comprising:
  - an oscillator operable to receive an error-correction signal and to generate an oscillator signal having a frequency that is related to the error-correction signal;
  - a frequency divider circuit operable to generate a feedback signal and a slave PWM signal derived from the oscillator signal for regulating the second regulated supply voltage;
  - a phase-frequency detector coupled to the oscillator and operable to receive the reference signal and to generate the error-correction signal based upon a phase difference between the reference signal and the feedback signal; and
  - a suppression circuit coupled to the phase-frequency detector and operable to periodically enable the phase-frequency detector to generate the error-correction signal.

17. The power supply system of claim 16 wherein the frequency divider circuit is operable to generate a second slave PWM signal for regulating a second power supply voltage.

18. The power supply system of claim 16 wherein the periodic interval at which the suppression circuit enables the phase-frequency detector is programmable.

19. A computer system, comprising:
a central processing unit connected to a bus system;
a video processor connected to the bus system and controlled by the CPU, the video processor comprising a plurality of electronic components, each electronic component powered by a power supply system, the power supply system comprising:
- a master PWM power supply that generates first regulated supply voltage and a master PWM signal; and
- a slave PWM power supply that generates a second regulated supply voltage and receives the master PWM signal, the slave PWM power supply comprising:
  - an input node operable to receive the master PWM signal; and
  - a phase-locked loop comprising:
    - an oscillator operable to receive an error-correction signal and to generate an oscillator signal having a frequency that is related to the error-correction signal;
    - a frequency divider circuit operable to generate a feedback signal and a slave PWM signal derived from the oscillator signal for regulating the second regulated supply voltage;
a phase-frequency detector coupled to the oscillator and operable to receive the reference signal and to generate the error-correction signal based upon a phase difference between the reference signal and the feedback signal; and
a suppression circuit coupled to the phase-frequency detector and operable to periodically enable the phase-frequency detector to generate the error-correction signal; and
a display device for displaying graphics and video data that is generated from the video processor.

20. A method for synchronizing a slave pulse-width modulation (PWM) controller to a master PWM controller, the method comprising:
periodically suppressing an error-correction signal in response to a logical AND of a portion of a master PWM signal from the master PWM controller and a portion of a feedback signal that is derived from an oscillator signal of the slave PWM controller and that is locked to the master PWM signal, the error-correction signal related to the phase difference between the master PWM signal and the feedback signal;
adjusting the oscillator signal in response to the periodically suppressed error-correction signal; and
generating a slave PWM signal from the oscillator signal.

21. A method for synchronizing a slave pulse-width modulation (PWM) controller to a master PWM controller, the method comprising:
periodically suppressing an error-correction signal based upon the phase difference between a master PWM signal from the master PWM controller and a feedback signal that is derived from an oscillator signal of the slave PWM controller;
adjusting the oscillator signal in response to the periodically suppressed error-correction signal;
generating a slave PWM signal from the oscillator signal; and
counting the number of transitions of one of the master PWM signal and the feedback signal to determine when to suppress the error-correction signal.

22. The method of claim 20 further comprising generating a second slave PWM signal from the oscillator signal.

23. The method of claim 20 further comprising shifting the phase of the slave PWM signal with respect to the phase of the master PWM signal.

24. A method for synchronizing a slave pulse-width modulation (PWM) controller to a master PWM controller, the method comprising:
periodically suppressing an error-correction signal based upon the phase difference between a master PWM signal from the master PWM controller and a feedback signal that is derived from an oscillator signal of the slave PWM controller;
adjusting the oscillator signal in response to the periodically suppressed error-correction signal;
generating a slave PWM signal from the oscillator signal; and
if the phase difference between a master PWM signal from the master PWM controller and a feedback signal that is derived from an oscillator signal of the slave PWM controller cannot be determined, then periodically suppressing the error-correction signal based upon the phase difference between a pre-determined default signal and the feedback signal.

25. A pulse-width modulation controller comprising:
a input node operable to receive a reference signal; and
a phase-locked loop comprising:
an oscillator operable to receive an error-correction signal and to generate a first PWM signal having a frequency that is related to the error-correction signal;
a phase-frequency detector coupled to the oscillator and operable to receive the reference signal and to generate the error-correction signal based upon a phase difference between the reference signal and a feedback signal derived from the PWM signal;
a suppression circuit coupled to the phase-frequency detector and operable to periodically enable the phase-frequency detector to generate the error-correction signal; and
wherein the suppression circuit is operable to enable the phase-frequency detector once every predetermined number of transitions of the feedback signal.

26. A pulse-width modulation controller comprising:
a input node operable to receive a reference signal; and
a phase-locked loop comprising:
an oscillator operable to receive an error-correction signal and to generate a first PWM signal having a frequency that is related to the error-correction signal;
a phase-frequency detector coupled to the oscillator and operable to receive the reference signal and to generate the error-correction signal based upon a phase difference between the reference signal and a feedback signal derived from the PWM signal; and
a suppression circuit coupled to the phase-frequency detector and operable to periodically enable the phase-frequency detector to generate the error-correction signal; and
wherein the suppression circuit includes a counter that enables the phase-frequency detector once every predetermined number of transitions of a reset signal, the reset signal transitioning when the reference signal and the feedback signal have the same logic level.

27. The pulse-width modulation controller of claim 1 wherein the suppression circuit is operable to periodically disable the phase-frequency detector from generating the error-correction signal in response to a logical AND of a portion of the reference signal and a portion of the feedback signal.

28. The pulse-width modulation controller of claim 6 wherein the suppression circuit is operable to enable the phase-frequency detector once every predetermined number of transitions of a logical AND of a portion of the reference and a portion of the feedback signal.

29. The pulse-width modulation controller of claim 8 wherein the suppression circuit enables the phase-frequency detector once every predetermined number of transitions of a reset signal, the reset signal transitioning when the reference signal and the feedback signal have a high logic level.

30. The pulse-width modulation controller of claim 26 wherein the suppression circuit includes a counter that enables the phase-frequency detector once every predetermined number of transitions of a reset signal, the reset signal transitioning when the reference signal and the feedback signal have a high logic level.

* * * * *